(12) United States Patent
Antonyan

(10) Patent No.: US 10,535,392 B2
(45) Date of Patent: Jan. 14, 2020

(54) INTEGRATED CIRCUIT MEMORY DEVICE WITH WRITE DRIVER AND METHOD OF OPERATING SAME

(71) Applicant: Samsung Electronics Co., Ltd., Suwon-si, Gyeonggi-do (KR)

(72) Inventor: Artur Antonyan, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/014,011

(22) Filed: Jun. 21, 2018

(65) Prior Publication Data

US 2018/0374525 A1    Dec. 27, 2018

(30) Foreign Application Priority Data

Jun. 26, 2017 (KR) .......................... 10-2017-0080523
Mar. 19, 2018 (KR) .......................... 10-2018-0031548

(51) Int. Cl.
*G11C 11/16* (2006.01)

(52) U.S. Cl.
CPC ...... *G11C 11/1675* (2013.01); *G11C 11/1655* (2013.01); *G11C 11/1657* (2013.01); *G11C 11/1659* (2013.01); *G11C 11/1673* (2013.01); *G11C 11/1697* (2013.01); *G11C 11/161* (2013.01)

(58) Field of Classification Search
CPC ............ G11C 11/1675; G11C 11/1673; G11C 11/1659; G11C 11/1697; G11C 11/1655; G11C 11/1657; G11C 11/161; G11C 13/0069; G11C 13/0002

See application file for complete search history.

(56) References Cited

U.S. PATENT DOCUMENTS

| 8,498,144 | B2 | 7/2013 | Takahashi et al. |
| 8,705,270 | B2 | 4/2014 | Takahashi et al. |
| 8,780,623 | B2 | 7/2014 | Em et al. |
| 9,047,965 | B2 | 6/2015 | Alam et al. |
| 9,082,496 | B2 | 7/2015 | Lee et al. |
| 9,153,318 | B2 | 10/2015 | Yim |
| 9,196,342 | B2 | 11/2015 | Alam et al. |
| 9,336,881 | B2 | 5/2016 | Shimakawa et al. |
| 9,583,171 | B2 | 2/2017 | Kim et al. |
| 9,805,780 | B2 | 10/2017 | Itai et al. |
| 2009/0238013 | A1* | 9/2009 | Hanzawa ................. G11C 7/14 365/189.15 |

(Continued)

FOREIGN PATENT DOCUMENTS

JP    2016062634    4/2016

*Primary Examiner* — David Lam
(74) *Attorney, Agent, or Firm* — Myers Bigel, P.A.

(57) ABSTRACT

A memory device includes a memory cell array that includes memory cells, a row decoder that is connected with the memory cell array through word lines, a column decoder that is connected with the memory cell array through bit lines and source lines, and a write driver that outputs a write voltage in a write operation. The column decoder includes switches, which are respectively connected to the bit lines and are respectively connected to the source lines. During the write operation, a selected switch of the switches transfers the write voltage to a selected bit line of the bit lines. Each unselected switch of the switches electrically separates the write driver from a corresponding unselected bit line of the bit lines by using the write voltage.

19 Claims, 7 Drawing Sheets

(56) References Cited

U.S. PATENT DOCUMENTS

| | | | |
|---|---|---|---|
| 2012/0294064 A1* | 11/2012 | Kitagawa | G11C 13/0007 365/148 |
| 2013/0028010 A1 | 1/2013 | Li et al. | |
| 2014/0092665 A1* | 4/2014 | Ueda | G11C 13/0002 365/63 |
| 2016/0307615 A1 | 10/2016 | Andre et al. | |
| 2017/0069397 A1 | 3/2017 | Andre et al. | |

* cited by examiner

INTEGRATED CIRCUIT MEMORY DEVICE WITH WRITE DRIVER AND METHOD OF OPERATING SAME

REFERENCE TO PRIORITY APPLICATION

This application claims priority under 35 U.S.C. § 119 to Korean Patent Application Nos. 10-2017-0080523, filed Jun. 26, 2017 and 10-2018-0031548, filed Mar. 19, 2018, the disclosures of which are hereby incorporated herein by reference in their entireties.

BACKGROUND

Embodiments of the inventive concept relate to semiconductor devices and, more particularly, to memory devices and methods of operating memory devices. A memory device may include memory cells and may store data in the memory cells. A memory device that needs power to retain data stored in memory cells is called a "volatile memory device", whereas a memory device that does not need power to retain data stored in memory cells is called a "nonvolatile memory device".

An operation of storing data in memory cells is called a "write operation". To perform the write operation of the memory device, a write voltage or a write current of a certain level may be applied to memory cells.

As memory devices are designed to be suitable for low power, the power supply voltage supplied to the memory devices decreases. And, as the power supply voltage decreases, the power supply voltage may be lower than a typical write voltage. Accordingly, as the power supply voltage decreases, new issues may occur in the memory device that may impact reliability of operation.

SUMMARY

Embodiments of the inventive concept provide a memory device and a method of operating a memory device, which solve an issue that may occur as a power supply voltage is lowered to a level that is less than a typical write voltage.

According to some embodiments of the inventive concept, a memory device includes a memory cell array that includes memory cells, a row decoder that is connected with the memory cell array through word lines, a column decoder that is connected with the memory cell array through bit lines and source lines, and a write driver that outputs a write voltage in a write operation. The column decoder includes switches, which are respectively connected to the bit lines and are respectively connected to the source lines. During the write operation, a selected switch of the switches transfers the write voltage to a selected bit line of the bit lines, and an unselected switch of the switches electrically separates the write driver from an unselected bit line of the bit lines by using the write voltage.

According to another embodiment of the inventive concept, a memory device includes a memory cell array that includes memory cells, a row decoder that is connected with the memory cell array through word lines, a column decoder that is connected with the memory cell array through bit lines and source lines, a write driver that outputs a write voltage in a write operation, and a sense amplifier that outputs a read voltage in a read operation. The column decoder includes switches that are respectively connected to the bit lines and are respectively connected to the source lines, and a read and write decoder that connects the bit lines and the source lines with the write driver during the write operation and to connect the bit lines and the source lines with the sense amplifier during the read operation. Each of the switches may include a first NMOS transistor and a first PMOS transistor, which connect the corresponding bit line and the write driver. During the write operation, in a switch selected from the switches, a power supply voltage is transferred to a gate of the first NMOS transistor, and a ground voltage is transferred to a gate of the first PMOS transistor. However, also during the write operation, in an unselected switch of the switches, the ground voltage is transferred to the gate of the first NMOS transistor, and the write voltage is transferred to the gate of the first PMOS transistor.

According to an additional embodiment of the inventive concept, a method of operating a memory device, which includes memory cells connected to word lines, bit lines, and source lines, includes establishing a power supply voltage and a ground voltage at a first transmission gate connected to a bit line selected from the bit lines, to thereby transfer a write voltage to the selected bit line, and establishing the write voltage and the ground voltage at a second transmission gate connected to an unselected bit line of the bit lines to thereby transfer the write voltage to the unselected bit line.

According to still further embodiments of the inventive concept, a memory device is provided having an array of memory cells therein, which are disposed on an integrated circuit substrate. A column decoder is provided, which has a plurality of bidirectional switching circuits therein. Each of these bidirectional switching circuits are electrically coupled by a plurality of pairs of bit lines (e.g., BL, SL pairs) to a corresponding plurality of columns of memory cells in the array of memory cells. The plurality of bidirectional switching circuits includes a first bidirectional switching circuit having a first read/write decoder and a first plurality of switches therein. The first plurality of switches includes a first switch having a first pair of terminals that are electrically coupled to a first of the plurality of pairs of bit lines and a second pair of terminals that are electrically coupled to the first read/write decoder. The first switch is responsive to at least a first bit line access signal (e.g., BLA, /BLA), which sets an enabled/disabled state within the first switch.

In some of these embodiments of the inventive concept, the first switch is configured to: (i) electrically couple the first of the plurality of pairs of bit lines together and to a first reference voltage when the at least a first bit line access signal is in a first "disabled" logic state, and (ii) electrically couple the first of the plurality of pairs of bit lines to the first read/write decoder when the at least a first bit line access signal is in a second "enabled" logic state, opposite the first logic state. A second switch may also be provided within the first plurality of switches, and this second switch may have a first pair of terminals electrically coupled to a second of the plurality of pairs of bit lines and a second pair of terminals electrically coupled to the first read/write decoder and to the second pair of terminals associated with the first switch.

In addition, a first write driver may be provided, which is electrically coupled to a write port of the first read/write decoder, and a first sense amplifier may be provided, which is electrically coupled to a read port of the first read/write decoder. The first read/write decoder may be responsive to a write control signal and a read control signal, so that the first write driver is electrically coupled to the second pair of terminals associated with the first switch and the second pair of terminals associated with the second switch when the write control signal is active. Likewise, the first sense amplifier may be electrically coupled to the second pair of terminals associated with the first switch and the second pair of terminals associated with the second switch when the read control signal is active. The first switch may also be configured to electrically couple the first of the plurality of pairs of bit lines to the first read/write decoder via a first pair of CMOS transmission gates, which are responsive to the at least a first bit line access signal.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Figure 1:
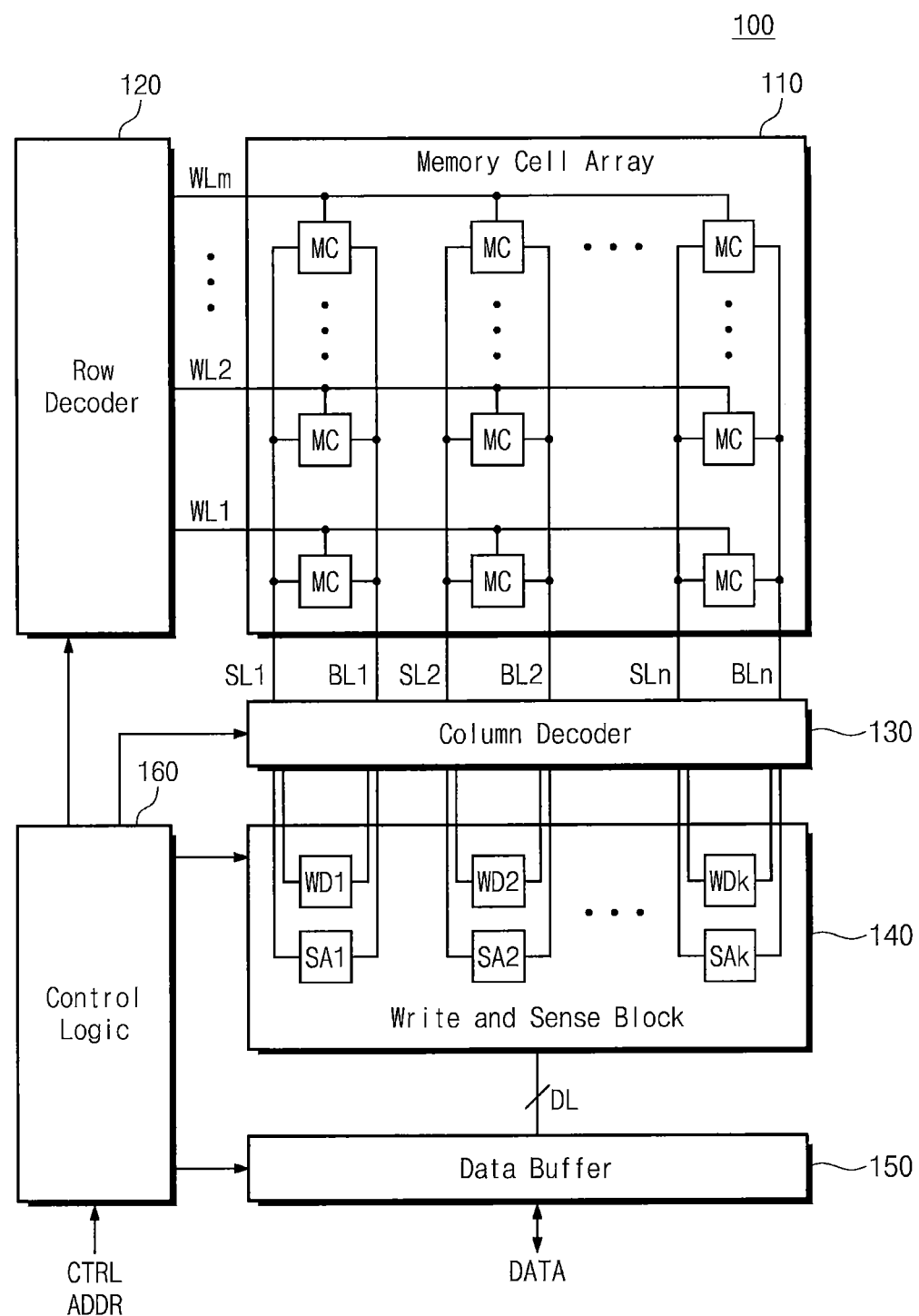
FIG. 1 is a block diagram illustrating a memory device according to an embodiment of the inventive concept.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating a memory device 100 according to an embodiment of the inventive concept. The memory device 100 may include a volatile memory such as a dynamic random access memory (DRAM) or a static RAM (SRAM). The memory device 100 may include a nonvolatile memory device such as a flash memory device, a magnetic RAM (MRAM) device, a phase-change RAM (PRAM) device, a ferroelectric RAM (FRAM) device, or a resistive RAM (RRAM) device. For purposes of discussion herein, it is assumed that the memory device 100 is the MRAM device. However, the inventive concepts described herein are not limited to only MRAM-type memory devices. Instead, the technical ideas of the inventive concept may be applied to various memory devices such as various volatile memory devices and various nonvolatile memory devices.

Referring to FIG. 1, the memory device 100 includes a memory cell array 110, a row decoder 120, a column decoder 130, a write and sense block 140, a data buffer 150, and control logic 160. The memory cell array 110 includes memory cells MC. The memory cells MC are connected to source lines SL1 to SLn (n being a positive integer), bit lines BL1 to BLn, and word lines WL1 to WLm (m being a positive integer). The memory cells MC may be arranged in rows and columns. The rows of memory cells MC may be respectively connected to the word lines WL1 to WLm. The columns of memory cells MC may be respectively connected to the source lines SL1 to SLn and the bit lines BL1 to BLn.

The row decoder 120 may control voltages of the word lines WL1 to WLm under control of the control logic 160. For example, the row decoder 120 may apply a selection voltage for read or write to a selected word line and may apply a non-selection voltage (or voltages) for read or write inhibition to unselected word lines.

The column decoder 130 is connected to the source lines SL1 to SLn and the bit lines BL1 to BLn. The column decoder 130 is connected with the write and sense block 140. Under control of the control logic 160, the column decoder 130 may electrically connect some source lines selected from the source lines SL1 to SLn and some bit lines selected from the bit lines BL1 to BLn.

Under control of the control logic 160, the column decoder 130 may apply bias voltages to the remaining source lines (i.e., unselected source lines) of the source lines SL1 to SLn and the remaining bit lines (i.e., unselected source lines) of the bit lines BL1 to BLn. The bias voltages may be determined to have no influence on a write operation or a read operation on selected memory cells connected to the selected word line, the selected bit lines, and the selected source lines, and may include, for example, a ground voltage.

When applying the bias voltages to the unselected source lines or the unselected bit lines, the column decoder 130 may block a write voltage to be transferred (or may prevent a write voltage from being transferred) to the unselected source lines or the unselected bit lines by using the write voltage higher than a power supply voltage. Since the write voltage is used, the column decoder 130 may prevent occurrence of leakage.

The write and sense block 140 includes write drivers WD1 to WDk (k being a positive integer) and sense amplifiers SA1 to SAk. During a write operation, the write drivers WD1 to WDk may be connected with the selected bit lines and the selected source lines through the column decoder 130. For example, each of the write drivers WD1 to WDk may be connected to one selected bit line and one selected source line.

The write drivers WD1 to WDk may write data in selected memory cells MC. For example, when a state of a certain memory cell is different from a state that data to be written in the certain memory cell indicates, a write driver associated with the certain memory cell may change the state of the certain memory cell.

For example, when changing data of the certain memory cell, the write driver associated with the certain memory cell may transfer a write voltage to one of a source line and a bit line connected to the certain memory cell and a low voltage (e.g., ground voltage) to the other thereof. However, when the state of the certain memory cell is identical to the state that data to be written in the certain memory cell indicates, the write driver associated with the certain memory cell may maintain the state of the certain memory cell without modification. When maintaining data of the certain memory cell without modification, the write driver associated with the certain memory cell may transfer a write-inhibit voltage, for example, the ground voltage to the source line and the bit line connected to the certain memory cell.

During a read operation, the sense amplifiers SA1 to SAk may be connected with the selected bit lines and the selected source lines through the column decoder 130. For example, each of the sense amplifiers SA1 to SAk may be connected to one selected bit line and one selected source line.

The write drivers WD1 to WDk may transfer a write voltage to the selected bit lines or the selected source lines. For example, the write drivers WD1 to WDk may transfer the write voltage to the selected bit lines, when switching the states of the memory cells MC from first states (e.g., a low-resistance or high-resistance state) to second states (e.g., a high-resistance or low-resistance state). And, the write drivers WD1 to WDk may transfer the write voltage to the source lines, when switching the states of the memory cells MC from the second states to the first states.

The data buffer 150 is connected with the write and sense block 140 through data lines DL. The data buffer 150 may exchange data "DATA" with an external device (e.g., a memory controller) under control of the control logic 160. For example, in the write operation, the data buffer 150 may transfer data "DATA" received from the external device to the write drivers WD1 to WDk. However, during a read operation, the data buffer 150 may output data "DATA" transferred from the sense amplifiers SA1 to SAk to the external device.

The control logic 160 may receive a control signal CTRL and an address ADDR from the external device (e.g., a memory controller). In response to the control signal CTRL and the address ADDR, the control logic 160 may control the row decoder 120, the column decoder 130, the write and sense block 140, and the data buffer 150 such that the write operation or the read operation is performed.

Figure 2:
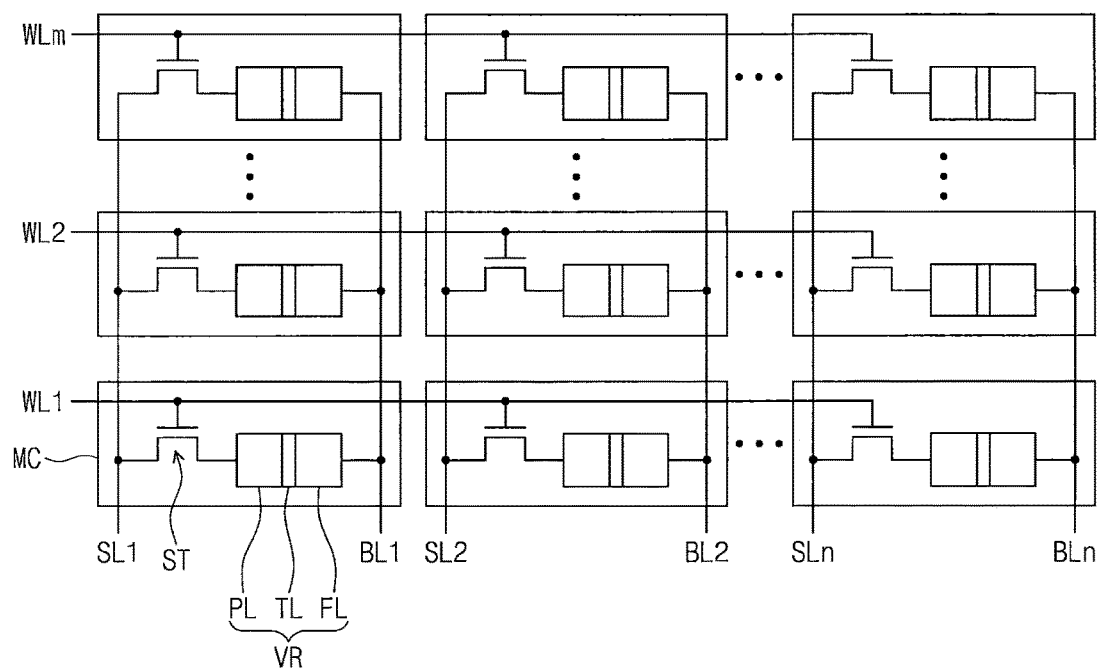
FIG. 2 is an electrical schematic of memory cells that may be utilized in the memory device of FIG. 1.
Figure 3:
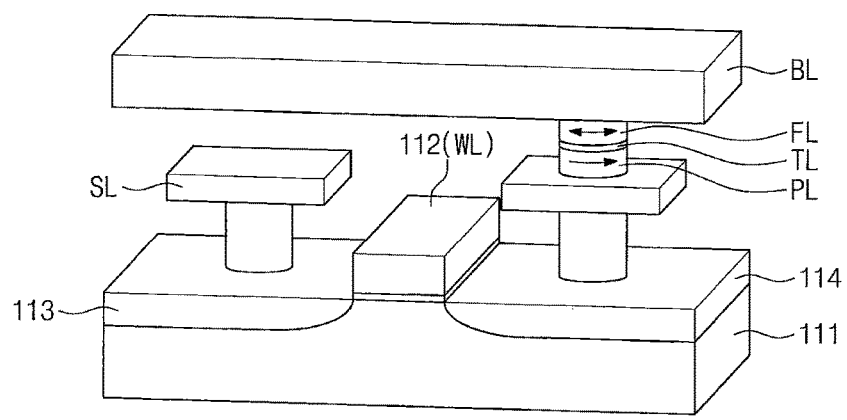
FIG. 3 is a perspective view of an exemplary memory cell that may be used in the memory device of FIG. 1.

FIG. 2 illustrates an example of the memory cells MC of the memory cell array 110 and FIG. 3 illustrates one example of the memory cells MC. Referring to FIGS. 1 through 3, each memory cell includes a selection transistor ST and a variable resistance element VR. The selection transistor ST includes a first junction 113 formed in a body 111 and connected with a source line SL, a second junction 114 formed in the body 111 and connected with a bit line BL through the variable resistance element VR, and a gate 112 formed on/above the body 111 between the first and second junctions 113 and 114 and forming a word line WL.

The variable resistance element VR includes a pinned layer PL, a tunneling layer TL, and a free layer FL. The pinned layer PL has a pinned magnetization direction. The free layer FL has a magnetization direction that varies with a voltage (or a current) applied to the variable resistance element VR. As will be understood by those skilled in the art, the resistance of the variable resistance element VR may change depending on whether the magnetization direction of the free layer FL is identical to the magnetization direction of the pinned layer PL (or how much the magnetization direction of the free layer FL is identical to the magnetization direction of the pinned layer PL) or different from the magnetization direction of the pinned layer PL (or how much the magnetization direction of the free layer FL is different from the magnetization direction of the pinned layer PL). The variable resistance element VR may store data in the form of a magnitude of resistance.

For example, when a write voltage is applied to the bit line BL and a low voltage (e.g., a ground voltage) is applied to the source line SL, a current may flow from the bit line BL to the source line SL. In this case, the magnetization direction of the free layer FL may be opposite to the magnetization direction of the pinned layer PL. The variable resistance element VR or the memory cell MC may be a high-resistance state (e.g., a second state).

When the write voltage is applied to the source line SL and the low voltage (e.g., a ground voltage) is applied to the bit line BL, a current may flow from the source line SL to the bit line BL. In this case, the magnetization direction of the free layer FL may be identical to the magnetization direction of the pinned layer PL. The variable resistance element VR or the memory cell MC may be a low-resistance state (e.g., a first state).

Figure 4:
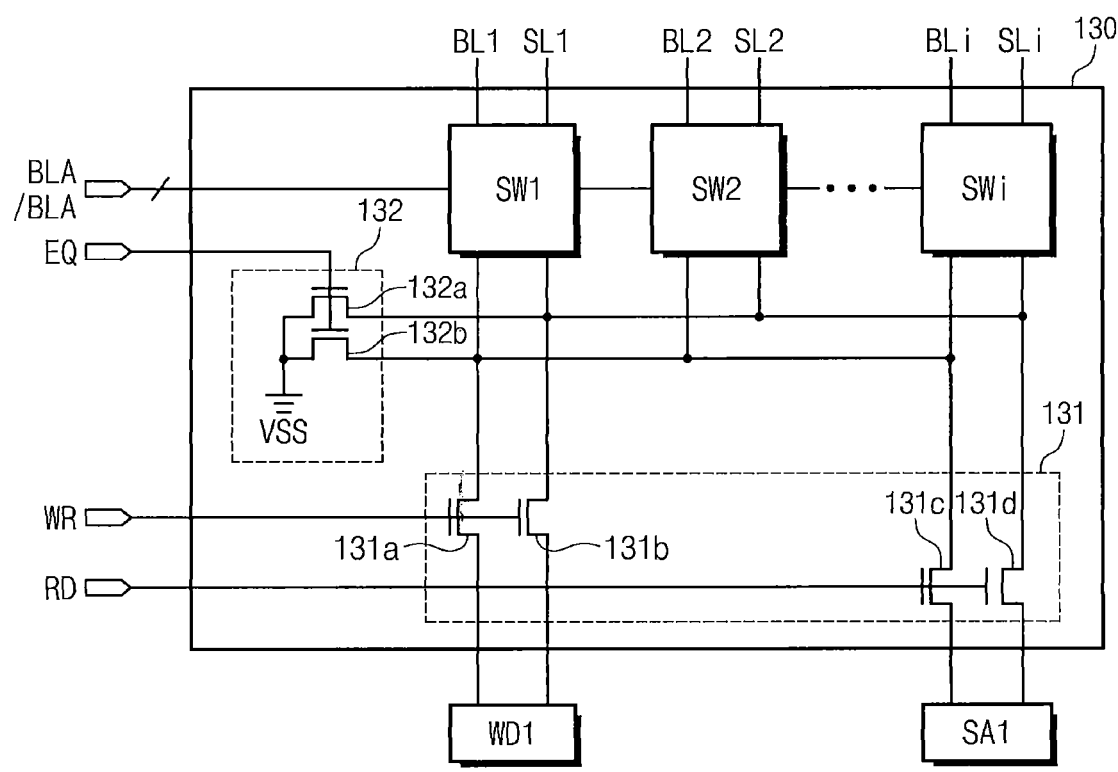
FIG. 4 is an electrical schematic of a column decoder according to an embodiment of the inventive concept.

FIG. 4 is a diagram illustrating the column decoder 130 according to an embodiment of the inventive concept. In an embodiment, components that correspond to one write driver (e.g., WD1) and one sense amplifier (e.g., SA1) are illustrated in FIG. 4. Referring to FIG. 4, the column decoder 130 includes first to i-the switches SW1 to SWi (i being a positive integer), a read and write decoder 131, and an equalizer 132. The first to i-th switches SW1 to SWi may be respectively connected with first to i-th bit lines BL1 to BLi and may be respectively connected with first to i-th source lines SL1 to SLi. The first to i-th switches SW1 to SWi may operate in response to bit line signals BLA and inverted bit line signals /BLA (e.g., BLA<1:i>, /BLA<1:i>). For example, different bit line signals BLA may be transferred to the first to i-th switches SW1 to SWi through different signal lines. Different inverted bit line signals /BLA may be transferred to the first to i-th switches SW1 to SWi through different signal lines.

Depending on the bit line signals BLA and the inverted bit line signals /BLA, one switch of the first to i-th switches SW1 to SWi may be selected, and the remaining switches may not be selected. The selected switch (e.g., SW1) may connect the read and write decoder 131 with a selected bit line (e.g., BL1) and a selected source line (e.g., SL1), which are connected to the selected switch SW1. The selected switch SW1 may transfer, to the selected bit line BL1 and the selected source line SL1, voltages transferred from the write driver WD1 or the sense amplifier SA1 through the read and write decoder 131.

Unselected switches (e.g., SW2 to SWi) may electrically separate the read and write decoder 131 from unselected bit lines (e.g., BL2 to BLi) and unselected source lines (e.g., SL2 to SLi), which are connected to the unselected switches SW2 to SWi. The unselected switches SW2 to SWi may apply bias voltages to the unselected bit lines BL2 to BLi and the unselected source lines SL2 to SLi.

The bias voltages may be determined to have no influence on a write operation or a read operation, which the write driver WD1 or the sense amplifier SA1 performs on a memory cell through the selected switch SW1. For example, the bias voltages may include aground voltage VSS.

In an embodiment, the unselected switches SW2 to SWi may inhibit a write voltage transferred from the write driver WD1 from being transferred to the unselected bit lines BL2 to BLi or the unselected source lines SL2 to SLi by using the write voltage higher than a power supply voltage VDD. Since the write voltage is used, the unselected switches SW2 to SWi may prevent occurrence of leakage.

The read and write decoder 131 may connect one of the write driver WD1 and the sense amplifier SA1 to the first to i-th switches SW1 to SWi. For example, in a write operation, the read and write decoder 131 may connect the write driver WD1 to the first to i-th switches SW1 to SWi.

The write driver WD1 may apply voltages to the selected bit line BL1 and the selected source line SL1 through the read and write decoder 131 and the selected switch SW1 of the first to i-th switches SW1 to SWi. For example, to switch a state of a memory cell from the first state to the second state, the write driver WD1 may apply the write voltage to the selected bit line BL1 and may apply the ground voltage to the selected source line SL1. Alternatively, to switch a state of a memory cell from the second state to the first state, the write driver WD1 may apply the write voltage to the selected source line SL1 and may apply the ground voltage to the selected bit line BL1.

During a read operation, the read and write decoder 131 may connect the sense amplifier SA1 to the first to i-th switches SW1 to SWi. The sense amplifier SA1 may apply voltages to the selected bit line BL1 and the selected source line SL1 through the read and write decoder 131 and the selected switch SW1 of the first to i-th switches SW1 to SWi. The read and write decoder 131 may include write transistors 131a and 131b connecting the write driver WD1 with the first to i-th switches SW1 to SWi, and read transistors 131c and 131d connecting the sense amplifier SA1 with the first to i-th switches SW1 to SWi.

The write transistors 131a and 131b may operate in response to a write signal WR. For example, when the write signal WR is activated (e.g., to a high level), the write transistors 131a and 131b may electrically connect the write driver WD1 with the first to i-th switches SW1 to SWi. In addition, the read transistors 131c and 131d may operate in response to a read signal RD. For example, when the read signal RD is activated (e.g., to a high level), the read transistors 131c and 131d may electrically connect the sense amplifier SA1 with the first to i-th switches SW1 to SWi.

The equalizer 132 operates in response to an equalization signal EQ. The equalizer 132 may equalize voltages of nodes or wirings (or interconnections) between the read and write decoder 131 and the first to i-th switches SW1 to SWi to the ground voltage VSS. The equalizer 132 may include equalization transistors 132a and 132b transferring the ground voltage VSS in response to the equalization signal EQ.

In one embodiment, the bit line signal BLA, the inverted bit line signal /BLA, the equalization signal EQ, the write signal WR, and the read signal RD may be controlled by the control logic 160. In addition, when the write operation is not performed, the control logic 160 may deactivate the bit line signal BLA to a low level and may deactivate the inverted bit line signal /BLA to the high level. However, when a write voltage VWR is applied in the write operation, the control logic 160 may activate the bit line signal BLA to the high level and may activate the inverted bit line signal /BLA to the low level.

Before the write voltage VWR is applied in the write operation, the control logic 160 may set the equalization signal EQ to the high level to perform an equalization operation. For example, after the equalization operation is completed, the control logic 160 may deactivate the equalization signal EQ to the low level and may activate the bit line signal BLA and the inverted bit line signal /BLA.

Figure 5:
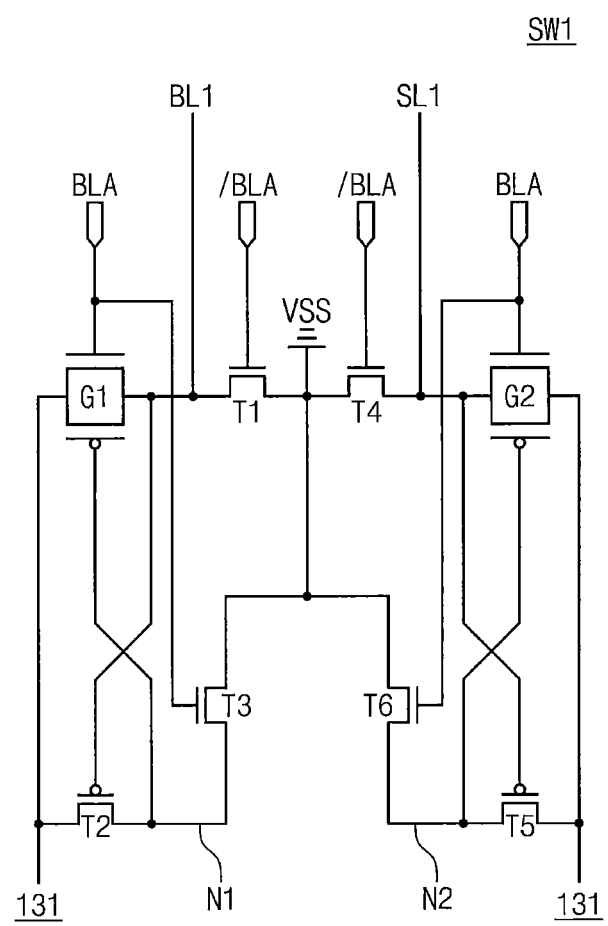
FIG. 5 is an electrical schematic of a switch according to an embodiment of the inventive concept.

FIG. 5 is a diagram illustrating a switch (e.g., SW1) according to an embodiment of the inventive concept. Referring to FIGS. 4 and 5, the switch SW1 may include first to sixth transistors T1 to T6, and first and second transmission gates G1 and G2.

The first transmission gate G1 may include a first end connected to the bit line BL1, a second end connected to the read and write decoder 131, a first gate to which the bit line signal BLA is transferred, and a second gate connected to a first node N1. The first transmission gate G1 may have a conventional structure in which an NMOS transistor having the first gate and a PMOS transistor having the second gate are connected in parallel, as shown.

When the switch SW1 is selected, the first transmission gate G1 may electrically connect the read and write decoder 131 with the bit line BL1. That is, the first transmission gate G1 may transfer a voltage transferred from the write driver WD1 or the sense amplifier SA1 to the bit line BL1.

The second transmission gate G2 may include a first end connected to the source line SL1, a second end connected to the read and write decoder 131, a first gate to which the bit line signal BLA is transferred, and a second gate connected to a second node N2. The second transmission gate G2 may have a conventional structure in which an NMOS transistor having the first gate and a PMOS transistor having the second gate are connected in parallel. Thus, when the switch SW1 is selected, the second transmission gate G2 may electrically connect the read and write decoder 131 with the source line SL1. That is, the second transmission gate G2 may transfer a voltage transferred from the write driver WD1 or the sense amplifier SA1 to the source line SL1.

The first transistor T1 may include a first end connected to the bit line BL1, a second end connected to a ground node to which the ground voltage VSS is applied, and a gate to which the inverted bit line signal /BLA is transferred. The first transistor T1 may apply a bias voltage, for example, the ground voltage VSS to the bit line BL1 when the switch SW1 is not selected.

The second transistor T2 may have a first end connected to the read and write decoder 131, a second end connected to the first node N1, and a gate connected to the bit line BL1. Accordingly, when the switch SW1 is not selected, the second transistor T2 may transfer a voltage transferred from the write driver WD1 or the sense amplifier SA1 to a gate of the first transmission gate G1, e.g., a PMOS gate.

The third transistor T3 may have a first end connected to the ground node to which the ground voltage VSS is applied, a second end connected to the first node N1, and a gate connected to the bit line signal BLA. Thus, when the switch SW1 is selected, the third transistor T3 may transfer the ground voltage VSS to the first node N1.

The fourth transistor T4 may include a first end connected to the source line SL1, a second end connected to the ground node to which the ground voltage VSS is applied, and a gate to which the inverted bit line signal /BLA is transferred. The fourth transistor T4 may apply a bias voltage such as, for example, the ground voltage VSS to the source line SL1 when the switch SW1 is not selected.

The fifth transistor T5 may have a first end connected to the read and write decoder 131, a second end connected to a second node N2, and a gate connected to the source line SL1, as illustrated. When the switch SW1 is not selected, the fifth transistor T5 may transfer a voltage transferred from the write driver WD1 or the sense amplifier SA1 to a gate of the second transmission gate G2, e.g., a PMOS gate.

The sixth transistor T6 may have a first end connected to the ground node to which the ground voltage VSS is applied, a second end connected to the second node N2, and a gate connected to the bit line signal BLA. Based on this configuration, when the switch SW1 is selected, the sixth transistor T6 may transfer the ground voltage VSS to the second node N2.

Figure 6:
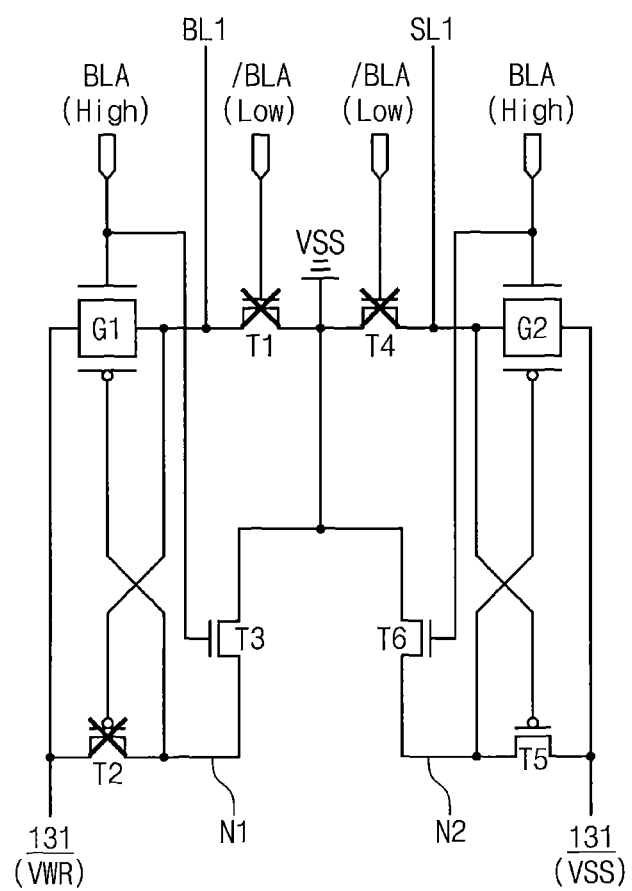
FIG. 6 is an electrical schematic of the switch of FIG. 5, with applied voltages that show an operation of the switch when the switch is selected.

FIG. 6 is a diagram illustrating an example of voltages applied to the switch SW1 when the switch SW1 is selected. Referring to FIGS. 4 and 6, the bit line signal BLA may be at the high level, that is, the power supply voltage VDD. The inverted bit line signal /BLA may be at the low level, that is, the ground voltage VSS.

The first and fourth transistors T1 and T4 are turned off according to the inverted bit line signal /BLA. The third and sixth transistors T3 and T6 are turned on according to the bit line signal BLA. The third transistor T3 may transfer the ground voltage VSS to the second gate of the first transmission gate G1, that is, a PMOS gate through the first node N1. The sixth transistor T6 may transfer the ground voltage VSS to the second gate of the second transmission gate G2, that is, a PMOS gate through the second node N2.

The first transmission gate G1 may be turned on due to the bit line signal BLA of the high level and the ground voltage VSS of the first node N1. The second transmission gate G2 may be turned on due to the bit line signal BLA of the high level and the ground voltage VSS of the second node N2. That is, the first and second transmission gates G1 and G2 may respectively transfer voltages transferred from the write driver WD1 to the bit line BL1 and the source line SL1.

In an embodiment, the write driver WD1 may switch a state of a memory cell connected to the switch SW1 from the first state to the second state. The write driver WD1 may apply the write voltage VWR to the bit line BL1 through the first transmission gate G1 and may apply the ground voltage VSS to the source line SL1 through the second transmission gate G2.

The second transistor T2 may be turned off due to the write voltage VWR. That is, the write voltage VWR and a voltage of the first node N1 may not affect each other. The fifth transistor T5 may be turned off due to the ground voltage VSS.

As described above, when the switch SW1 is selected in the write operation, in the case where the write driver WD1 switches a state of a memory cell from the first state to the second state, the write voltage VWR may be supplied to the bit line BL1, and the ground voltage VSS may be supplied to the source line SL1.

In the case where the write driver WD1 switches a state of a memory cell from the second state to the first state, the write voltage VWR may be supplied to the source line SL1, and the ground voltage VSS may be supplied to the bit line BL1. Compared with the example illustrated in FIG. 6, the second transistor T2 may be turned on, and the fifth transistor T5 may be turned off.

Figure 7:
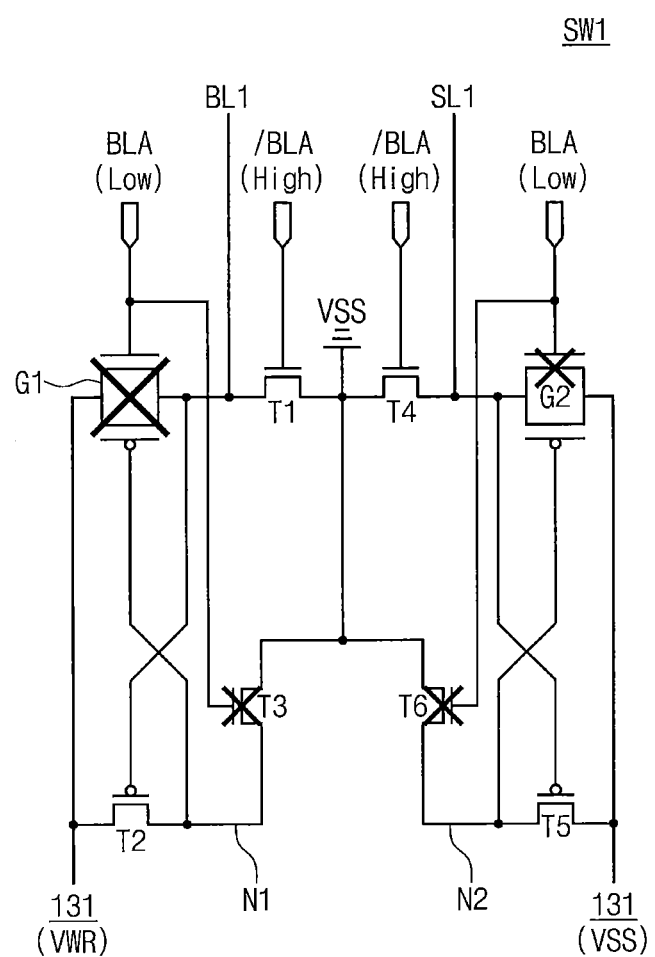
FIG. 7 is an electrical schematic of the switch of FIG. 5, with applied voltages that show an operation of the switch when the switch is not selected.

FIG. 7 is a diagram illustrating an example of voltages applied to the switch SW1 when the switch SW1 is selected. Referring to FIGS. 4 and 7, the bit line signal BLA may be at the low level, that is, the ground voltage VSS, whereas the inverted bit line signal /BLA may be at the high level, that is, the power supply voltage VDD. The first and fourth transistors T1 and T4 are turned on due to the inverted bit line signal /BLA. The first and fourth transistors T1 and T4 may transfer the ground voltage VSS to the bit line BL1 and the source line SL1, respectively. The third and sixth transistors T3 and T6 are turned off due to the bit line signal BLA.

The second transistor T2 may be turned on due to the ground voltage VSS of the bit line BL1. The second transistor T2 may transfer the write voltage VWR to the second gate of the first transmission gate G1, that is, a PMOS gate through the first node N1. The first transmission gate G1 may be turned off due to the bit line signal BLA and the write voltage VWR of the first node N1.

The fifth transistor T5 may be turned on due to the ground voltage VSS of the source line SL1. When turned on, the fifth transistor T5 may transfer the ground voltage VSS to the second gate of the second transmission gate G2, that is, a PMOS gate through the second node N2. The NMOS transistor of the second transmission gate G2 may be turned off due to the bit line signal BLA, and the PMOS transistor of the second transmission gate G2 may be turned on due to the ground voltage VSS of the second node N2.

Even though the second transmission gate G2 is partially turned on, the second transmission gate G2 transfers the ground voltage VSS. Accordingly, that the second transmission gate G2 is partially turned on may not affect driving the source line SL1 with the ground voltage VSS.

As described above, when the switch SW1 is not selected during a write operation, in the case where the write driver WD1 switches a state of a memory cell from the first state to the second state, the first transmission gate G1 may inhibit a write voltage from being transferred to the bit line BL1.

In general, the power supply voltage VDD is used to turn off a PMOS transistor of a transmission gate. When the power supply voltage VDD is applied to a gate of the PMOS transistor and the write voltage VWR higher than the power supply voltage VDD is applied to one end of the PMOS transistor, the PMOS transistor may be turned on. In this case, a current may flow to an unselected bit line and thereby cause a write error, an increase in power consumption, or a decrease in the write voltage VWR. However, the switch SW1 according to an embodiment of the inventive concept uses the write voltage VWR for the purpose of turning off the PMOS transistor of the first transmission gate G1. Accordingly, the PMOS transistor of the first transmission gate G1 may be prevented from turning on.

In another embodiment, when the write driver WD1 switches a state of a memory cell from the second state to the first state, the ground voltage VSS may be applied to the second gate of the first transmission gate G1, that is, a PMOS gate, and the write voltage VWR may be applied to the second gate of the second transmission gate G2, that is, a PMOS gate. Compared with the example illustrated in FIG. 7, the first transmission gate G1 may be partially turned on, and the second transmission gate G2 may be turned off.

Thus, as described hereinabove, a memory device 100 is provided having an array of memory cells 110 therein, which are disposed on an integrated circuit substrate. A column decoder 130 is provided, which may be configured as a plurality of column decoder units (e.g., 130_1, 130_2, . . . , 130_k), which can operate as a plurality of bidirectional switching circuits, corresponding to the write drivers WD1 to WDk or the sense amplifiers SA1 to SAk respectively. Each of these bidirectional switching circuits are electrically coupled by a plurality of pairs of bit lines (e.g., separate BL, SL pairs) to a corresponding plurality of columns of memory cells in the array 110 of memory cells. As illustrated by FIG. 4, the plurality of bidirectional switching circuits may include a first bidirectional switching circuit 130 (e.g., 130_1) having a first read/write decoder 131 and a first plurality of switches SW1, SW2, . . . , SWi therein. The first plurality of switches includes a first switch SW1 having a first pair of terminals, which are electrically coupled to a first (e.g., (BL1, SL1)) of the plurality of pairs of bit lines (e.g., (BL1, SL1), (BL2, SL2), . . . , (BLi, SLi)), and a second pair of terminals, which are electrically coupled to the first read/write decoder 131. The first switch SW1 is responsive to at least a first bit line access signal (e.g., BLA, /BLA), which sets an enabled/disabled state within the first switch SW1. Each of the first plurality of switches SW1, SW2, . . . , SWi have the same structure with the first switch SW1. The first plurality of switches SW1, SW2, . . . , SWi is responsive to separate bit line access signals (e.g., BLA, /BLA).

As illustrated by FIGS. 6-7, the first switch SW1 is configured to: (i) electrically couple the first (e.g., (BL1, SL1)) of the plurality of pairs of bit lines (e.g., (BL1, SL1), (BL2, SL2), . . . , (BLi, SLi)) together to a first reference voltage (e.g., VSS) when the at least a first bit line access signal (e.g., BLA, /BLA) is in a first "disabled" logic state (e.g., BLA=0), and (ii) electrically couple the first pair (e.g., (BL1, SL1)) of the plurality of pairs of bit lines (e.g., (BL1, SL1), (BL2, SL2), . . . , (BLi, SLi) to the first read/write decoder 131 when the at least a first bit line access signal is in a second "enabled" logic state (e.g., BLA=1), opposite the first logic state. A second switch (e.g., SW2) may also be provided within the first plurality of switches, and this second switch may have a first pair of terminals electrically coupled to a second (e.g., (BL2, SL2)) of the plurality of pairs of bit lines (e.g., (BL1, SL1), (BL2, SL2), . . . , (BLi, SLi)) and a second pair of terminals electrically coupled to the first read/write decoder 131. A first write driver (e.g., WD1) may be provided, which is electrically coupled to a write port of the first read/write decoder 131, and a first sense amplifier (e.g., SA1) may be provided, which is electrically coupled to a read port of the first read/write decoder 131. As shown, the first read/write decoder 131 may be responsive to a write control signal WR and a read control signal RD, so that the first write driver WD1 is electrically coupled to the second pair of terminals associated with each of the first plurality of switches (e.g., SW1, SW2, . . . , SWi) when the write control signal WR is active (e.g., WR=1). Likewise, the first sense amplifier SA1 may be electrically coupled to the second pair of terminals associated with each of the first plurality of switches (e.g., SW1, SW2, . . . , SWi) when the read control signal RD is active (e.g., RD=1). As shown by FIGS. 5-7, a switch, selected from among the first plurality of switches (e.g., SW1, SW2, . . . , SWi) responsive to the bit line access signals (e.g., BLA, /BLA), may be configured to electrically couple the first of the plurality of pairs of bit lines (e.g., (BL1, SL1), (BL2, SL2), . . . , (BLi, SLi)) to the first read/write decoder 131 via a first pair of CMOS transmission gates (G1, G2).

Figure 8:
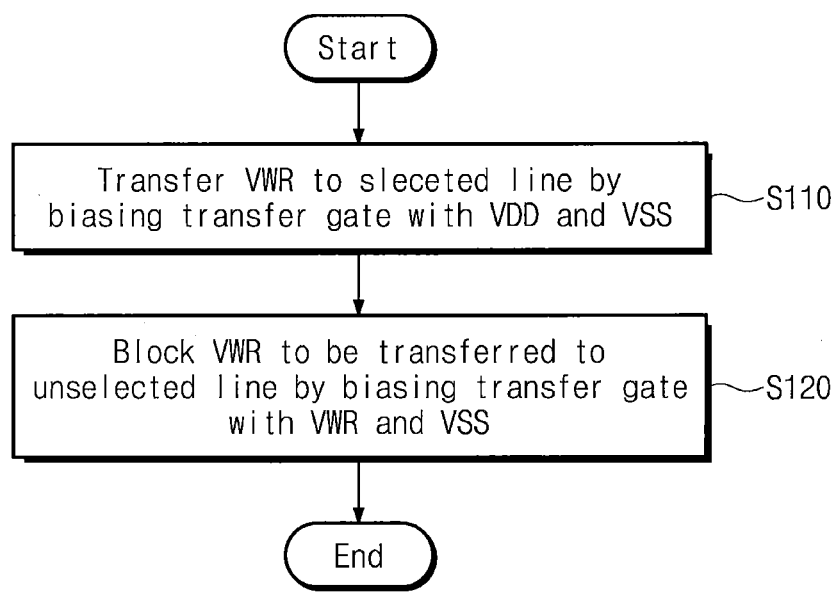
FIG. 8 is a flowchart of operations that illustrates a method of operating a memory device, according to an embodiment of the inventive concept.

FIG. 8 is a flowchart illustrating an operating method of the memory device 100 according to an embodiment of the inventive concept. Referring to FIGS. 1, 4, 5, and 8, in operation S110, a switch (e.g., SW1) of the memory device 100 may transfer the write voltage VWR to a selected line (e.g., BL1 or SL1) by establishing the power supply voltage VDD or the ground voltage VSS at a transmission gate (e.g., G1 or G2).

In operation S120, the switch SW1 of the memory device 100 may inhibit the write voltage VWR from being transferred to an unselected line (e.g., BL2 or SL2) by establishing the write voltage VWR and the ground voltage VSS at the transmission gate G1 or G2.

In the above-described embodiments, components of the memory device 100 are described by using the terms "first", "second", "third", and the like. However, the terms "first", "second", "third", and the like may be used to distinguish components from each other and do not limit the inventive concept. For example, the terms "first", "second", "third", and the like do not involve an order or a numerical meaning of any form.

In the above-described embodiments, components according to embodiments of the inventive concept are referred to by using the term "block". The "block" may be implemented with various hardware devices, such as an integrated circuit, an application specific IC (ASCI), a field programmable gate array (FPGA), and a complex programmable logic device (CPLD), software, such as firmware and applications driven in hardware devices, or a combination of a hardware device and software. Also, "block" may include circuits or intellectual property (IP) implemented with semiconductor devices.

According to embodiments of the inventive concept, a transmission gate of a switch that supplies or blocks a write voltage is established by the write voltage. Accordingly, a current/voltage is prevented from being leaked when the supply of the write voltage is blocked.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:
1. A memory device comprising:
a memory cell array including memory cells;
a row decoder connected with the memory cell array through word lines;
a column decoder connected with the memory cell array through bit lines and source lines; and
a write driver configured to output a write voltage in a write operation,
wherein the column decoder includes switches,
wherein each of the switches is connected to a corresponding bit line of the bit lines and a corresponding source line of the source lines, and
wherein, in the write operation, a selected switch of the switches transfers the write voltage to a selected bit line of the bit lines, and an unselected switch of the switches electrically separates the write driver from an unselected bit line of the bit lines by using the write voltage, wherein each of the switches includes:
a first transistor having a first end connected to a ground node, a gate to which an inverted bit line signal is transferred, and a second end connected to the corresponding bit line;
a second transistor having a first end connected to a first node, a gate connected to the corresponding bit line, and a second end connected to the write driver;
a third transistor connected between the ground node and the first node and controlled by a bit line signal; and
a first transmission gate connected between the second end of the first transistor and the write driver and controlled by the bit line signal and a voltage of the first node.

2. The memory device of claim 1, wherein each of the switches further includes:
a fourth transistor having a first end connected to the ground node, a gate to which the inverted bit line signal is transferred, and a second end connected to the corresponding source line;
a fifth transistor having a first end connected to a second node, a gate connected to the corresponding source line, and a second end connected to the write driver;
a sixth transistor connected between the ground node and the second node and controlled by the bit line signal; and
a second transmission gate connected between the second end of the fourth transistor and the write driver and controlled by the bit line signal and a voltage of the second node.

3. The memory device of claim 1, wherein the first transmission gate includes an NMOS transistor and a PMOS transistor connected between the corresponding bit line and the write driver, and
wherein, in the write operation, a power supply voltage is transferred to a gate of the NMOS transistor of the selected switch, and a ground voltage is transferred to a gate of the PMOS transistor of the selected switch.

4. The memory device of claim 3, wherein the write voltage is higher than the power supply voltage.

5. The memory device of claim 1, wherein the first transmission gate includes an NMOS transistor and a PMOS transistor connected between the corresponding bit line and the write driver, and
wherein, in the write operation, a ground voltage is transferred to a gate of the NMOS transistor of the unselected switch, and the write voltage is transferred to a gate of the PMOS transistor of the unselected switch.

6. The memory device of claim 1, further comprising:
a sense amplifier configured to output a read voltage in a read operation,
wherein the column decoder further includes:
a read and write decoder configured to connect the switches with the write driver in the write operation and to connect the switches with the sense amplifier in the read operation.

7. The memory device of claim 1, wherein the column decoder further includes:
an equalizer configured to equalize wirings between the switches and the write driver to a ground voltage in response to an equalization signal.

8. The memory device of claim 7, wherein, when the equalizer equalizes the wirings, the switches equalize the bit lines and the source lines to the ground voltage.

9. The memory device of claim 1, wherein the write operation switches a state of a memory cell selected from the memory cells from a first state to a second state, and
wherein, in a second write operation of switching the state of the selected memory cell from the second state to the first state, the selected switch transfers the write voltage to the selected source line, and the unselected switch electrically separates the write driver from the unselected source line by using the write voltage.

10. The memory device of claim 9, wherein the first transmission gate includes an NMOS transistor and a PMOS transistor connected between the corresponding source line and the write driver, and
wherein, in the second write operation, a power supply voltage is transferred to a gate of the NMOS transistor of the selected switch, and a ground voltage is transferred to a gate of the PMOS transistor of the selected switch.

11. The memory device of claim 10, wherein the power supply voltage is lower than the write voltage.

12. The memory device of claim 9, wherein the first transmission gate includes an NMOS transistor and a PMOS transistor connected between the corresponding source line and the write driver, and
wherein, in the second write operation, a ground voltage is transferred to a gate of the NMOS transistor of the unselected switch, and the write voltage is transferred to a gate of the PMOS transistor of the unselected switch.

13. A memory device comprising:
a memory cell array including memory cells;
a row decoder connected with the memory cell array through word lines;
a column decoder connected with the memory cell array through bit lines and source lines;
a write driver configured to output a write voltage in a write operation; and
a sense amplifier configured to output a read voltage in a read operation,
wherein the column decoder includes switches connected to the bit lines and the source lines,
wherein each of the switches is connected to a corresponding bit line of the bit lines and a corresponding source line of the source lines, and
a read and write decoder configured to connect the bit lines and the source lines with the write driver in the write operation and to connect the bit lines and the source lines with the sense amplifier in the read operation,
wherein each of the switches includes a first NMOS transistor and a first PMOS transistor, which connect the corresponding bit line and the write driver,
wherein, in the write operation, in a switch selected from the switches, a power supply voltage is transferred to a gate of the first NMOS transistor, and a ground voltage is transferred to a gate of the first PMOS transistor, and
wherein, in the write operation, in an unselected switch of the switches, the ground voltage is transferred to the gate of the first NMOS transistor, and the write voltage is transferred to the gate of the first PMOS transistor.

14. The memory device of claim 13, wherein the write voltage is higher than the power supply voltage.

15. The memory device of claim 13, wherein each of the switches includes a second NMOS transistor and a second PMOS transistor, which connect the corresponding source line and the read and write decoder, wherein, in the write operation, in the selected switch, a power supply voltage is transferred to a gate of the second NMOS transistor, and the ground voltage is transferred to a gate of the second PMOS transistor, and wherein, in the write operation, in the unselected switch, the ground voltage is transferred to the gate of the second NMOS transistor, and the write voltage is transferred to the gate of the second PMOS transistor.

16. The memory device of claim 13, wherein each of the switches further includes:

a transmission gate configured to transfer the ground voltage to the gate of the first PMOS transistor when a voltage of the gate of the first NMOS transistor is the power supply voltage.

17. The memory device of claim 13, wherein each of the switches further includes:

a second NMOS transistor configured to transfer the ground voltage to the corresponding bit line when a voltage of the gate of the first NMOS transistor is the ground voltage.

18. The memory device of claim 17, wherein each of the switches further includes:

a second PMOS transistor configured to transfer the write voltage to the gate of the first PMOS transistor depending on a voltage of the bit line.

19. An operating method of a memory device which includes memory cells connected to word lines, bit lines, and source lines, the method comprising:

establishing a power supply voltage and a ground voltage at a first transmission gate connected to a bit line selected from the bit lines to transfer a write voltage to the selected bit line; and establishing the write voltage and the ground voltage at a second transmission gate connected to an unselected bit line of the bit lines to block the write voltage to be transferred to the unselected bit line.

* * * * *